United States Patent
Lange et al.

(10) Patent No.: US 6,441,693 B1
(45) Date of Patent: Aug. 27, 2002

(54) CIRCUIT FOR VOLTAGE TO LINEAR DUTY CYCLE CONVERSION

(75) Inventors: Christopher M. Lange, New Hope; Greg T. Mrozek, Brooklyn Park, both of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/812,756

(22) Filed: Mar. 20, 2001

(51) Int. Cl.[7] ................................................. H03B 5/24
(52) U.S. Cl. ..................................... 331/143; 331/177 R
(58) Field of Search ................................. 331/111, 135, 331/143, 177 R

(56) References Cited

U.S. PATENT DOCUMENTS

| | | | |
|---|---|---|---|
| 5,146,188 A | * | 9/1992 | Suwada et al. ............. 331/111 |
| 5,361,048 A | | 11/1994 | Baum et al. |

* cited by examiner

*Primary Examiner*—David Mis

(57) ABSTRACT

A linear voltage-to-duty cycle converter is disclosed in which an input voltage to be converted is transformed to a triangle wave signal which has up and down ramps whose slopes are variable with the input voltage. A hysteresis comparator receives the triangle wave signal and produces a resulting output signal that has either a high value or a low value depending on the triangle wave signal condition. The time the resultant output signal is high or low compared to the overall time constitutes a duty cycle that is linear with respect to changes in the input voltage.

20 Claims, 1 Drawing Sheet

CIRCUIT FOR VOLTAGE TO LINEAR DUTY CYCLE CONVERSION

BACKGROUND OF THE INVENTION

1. Field of the Invention

This invention relates to circuits which convert voltage input to duty cycle output and more particularly to such a circuit in which the output varies linearly with the input.

2. Description of the Prior Art

Voltage-to-frequency or voltage-to-duty cycle conversion is often desired because the frequency or duty cycle is less susceptible to noise than an analog voltage. In some cases, the frequency or duty cycle is received by a microprocessor and converted in software to a voltage variable for use within the microprocessor. The use within the microprocessor is greatly simplified if the frequency or duty cycle is linearly proportional to the original input voltage. However, since voltage-to-frequency conversion circuits tend to be overly complex and expensive, a voltage-to-duty cycle conversion is preferred and, accordingly, the need for a simple, linear and inexpensive voltage-to-duty cycle converter has existed.

SUMMARY OF THE INVENTION

The present invention provides a low cost and simple voltage-to-duty cycle conversion that is linear with input voltage. The present invention provides a circuit that operates on the input voltage in a predetermined manner to create an output that varies along a first ramp from a first voltage to a second voltage and then back along a second ramp from the second voltage back to the first voltage. This output is presented to a hysteresis comparator to create a periodic pulse train the duty cycle of which is linearly proportional to the input voltage. The values of certain circuit components can be changed so as to change the slope of the ramps and thus the relationship between the output duty cycle and the input voltage. In accordance with the present invention, the linear relationship will, nevertheless, be maintained.

DETAILED DESCRIPTION OF THE PREFERRED EMBODIMENTS

Figure 1:
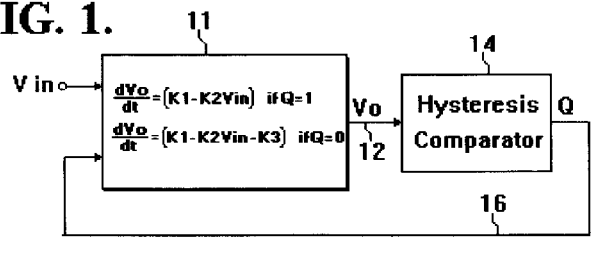
FIG. 1 shows a simplified block diagram of the basic functions of the present invention.
Figure 2:
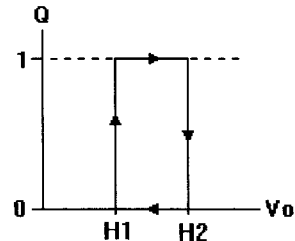
FIG. 2 shows the operation of the hysteresis comparator of FIG. 1.
Figure 3:
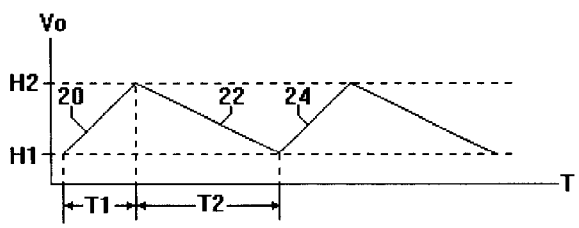
FIG. 3 shows an example of the variation of Vo with time for one Vin value.

In FIG. 1, Vin represents an input voltage that is to be converted to a duty cycle. Vin may be produced by a microprocessor, may be produced manually, or may be variable with some condition such as pressure or temperature. In any event, Vin is shown being applied to a first input of a box 11 that produces an output voltage Vo on a line 12 that is shown connected to a Hysteresis Comparator 14 that, in turn, produces an output Q on a line 16 that is fed back to a second input of Box 11. Box 11 is designed to operate with its two inputs, Vin and Q, to produce an output the slopes of which are given by the equations:

$$\frac{dVo}{dt} = K1 - K2(Vin) \quad \text{if } Q = 1 \quad (1)$$

$$\frac{dVo}{dt} = K1 - K2(Vin) - K3 \quad \text{if } Q = 0 \quad (2)$$

Where K1, K2 and K3 are constants with K1>(K2)(Vin) and, K3>K1−(K2)(Vin). Q will be either a low voltage (logical 0) or a high voltage (logical 1), depending on Vo, as will be seen in FIG. 2. In FIG. 2, the value of Q is plotted against values of Vo. It is seen that starting with Q being "1" at Vo=H1, Q remains a "1" until Vo reaches a value H2, at which point Q changes to a value of "0". Vo then starts becoming smaller until it reaches the value of H1, at which point Q again changes back to a value of "1" and Vo begins increasing again. An example of the variation of Vo with time is shown in FIG. 3 where it is seen that the value of Vo varies in a triangle-wave fashion between the values of H1 and H2. The slopes of the triangle wave are dependent on the value Vin and on the values of a variety of circuit components as will be explained in connection with FIG. 4. Assuming Q is a value of 1, the voltage Vo increases along ramp 20 for a time T1 until it reaches the value H2. As seen in FIG. 2, Q then changes to a 0 and Vo then decreases during a time T2 along a ramp 22 until it reaches a value H1. Now Q becomes 1 again and Vo increases along a ramp 24 and the operation repeats. In FIG. 3 it has been assumed that Vin does not change significantly during the cycle and, as a matter of fact, in most operations, the frequency of the up and down ramps is far greater than any change in Vin.

The linearity of the resulting duty cycle with Vin may be shown by the following mathematical analysis:

From equations (1) and (2) and FIG. 2, $$\frac{H2 - H1}{T1} = K1 - K2(Vin) \quad (3)$$

and, $$\frac{H1 - H2}{T2} = K1 - K2(Vin) - K3 \quad (4)$$

Therefore, $$T1 = \frac{H2 - H1}{K1 - K2(Vin)} \quad (5)$$

and, $$T2 = \frac{H1 - H2}{K1 - K2(Vin) - K3} \quad (6)$$

Now, the duty cycle is given by $$\frac{T1}{T1 + T2} \quad (7)$$

Which, by substitution of the values in equations (5) and (6) can be simplified to:

$$1 - \frac{K1 - K2(Vin)}{K3} \quad (8)$$

which shows that the duty cycle is linear with respect to Vin since all of the other elements are constant.

Figure 4:
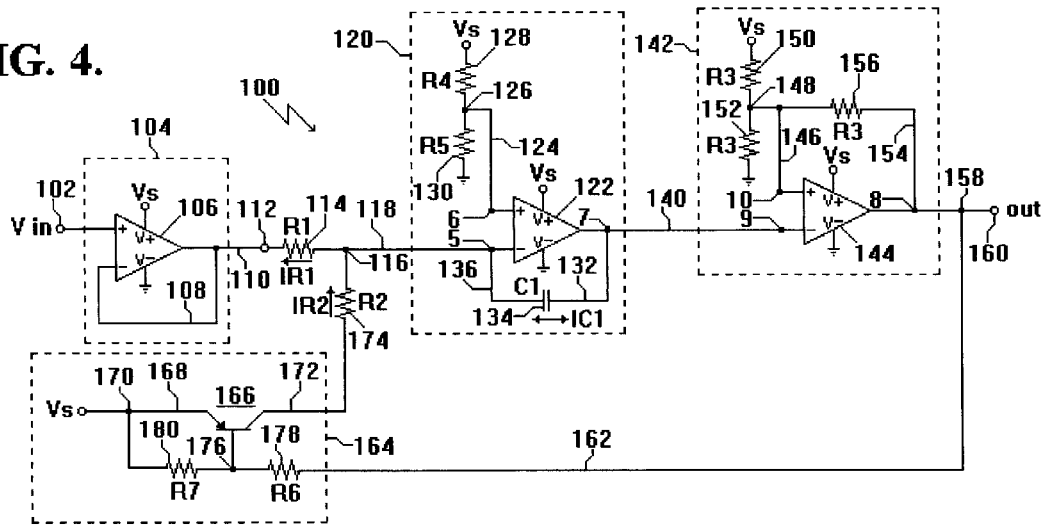
FIG. 4 shows a schematic diagram of one preferred embodiment of the present invention.

FIG. 4 shows one preferred embodiment of the present invention. In FIG. 4, a conversion circuit 100 is shown with the input voltage Vin first connected to a terminal 102 of a voltage follower circuit 104. Voltage follower circuit 104 is shown as an operational amplifier 106, having its non-inverting input terminal connected to Vin and its output terminal connected by a line 108 to its inverting input terminal so as to cause the output voltage on a line 110, to be the same as the input voltage Vin, as is well known in the art. The output terminal of the voltage follower circuit 104 is connected by line 110 to an input terminal 112 of the conversion circuit 100. It should be understood that, if the output impedance of the device that produces Vin does not affect the conversion circuit 100, then the voltage follower circuit 104 is not needed and Vin at terminal 102 may be connected directly to the input terminal 112 of the conversion circuit 100. In either event, input terminal 112 receives the voltage Vin and presents it through a resistor R1, identified by reference numeral 114, to a junction 116. The current through resistor 114 is designated IR1 and flows in the direction of the arrow adjacent thereto. Junction 116 is connected by a line 118 to an inverting integrating amplifier circuit 120, which is shown as an operational amplifier 122 having an inverting input terminal at a pin 5, a non-inverting input terminal at a pin 6, and an output at a pin 7. The inverting input terminal at pin 5 is connected to line 118 and the non-inverting input terminal at pin 6 is connected by a line 124 to a junction point 126 between a resistor R4, identified by reference numeral 128, connected to a source of voltage Vs and a resistor R5, identified by reference numeral 130, connected to a reference voltage or ground. Amplifier 122 has its output terminal at pin 7 connected by a line 132 through a feedback capacitor C1, identified by reference numeral 134, and then by a line 136 to the inverting input terminal at pin 5 of amplifier 122. The current through capacitor 134 is designated IC1 and may flow in either of the directions shown by the arrow adjacent thereto. As so connected, inverting integrating amplifier 120 will operate in accordance with equations (1) and (2) to produce the desired output voltage on a line 140 connected to the output terminal at pin 7 from amplifier 122, as will be explained. While in the preferred embodiment an inverting integrating amplifier 120, using the operational amplifier 122, the reference voltage at junction 126 and the feedback capacitor 134, has been employed, other circuits may be used to perform the operations of equations (1) and (2).

The output of amplifier 122 on line 140 is connected to a hysteresis comparator 142 having an operational amplifier 144 with its inverting input terminal at a pin 9 connected to line 140 and its non-inverting input terminal at a pin 10 connected by a line 146 to a junction point 148 between a first resistor R3 identified by reference numeral 150, connected to the source of voltage $V_s$ and a second resistor R3, identified by reference numeral 152, connected to the reference voltage or ground. The output of amplifier 144, from its output terminal at a pin 8, is connected by a line 154 through a third resistor R3, identified by reference numeral 156, to junction point 148. The output terminal at pin 8 is also connected to a junction 158 providing the system output at a terminal 160. Hysteresis comparator 142 is well known in the art to produce an output of either a first or second value depending on the input thereto. The output at terminal 160 is a pulse train having a duty cycle that varies linearly with the input voltage Vin. Junction 158 is also connected by a line 162 to a switch circuit 164 which employs a PNP transistor 166 having its emitter connected by a line 168 to a junction 170 connected to the voltage source Vs and its collector connected by a line 172 through a resistor R2, identified by reference numeral 174, to junction 116 and its base connected to a junction 176 between a resistor R6, identified by reference numeral 178, connected to line 162 and a resistor R7, identified by reference numeral 180, connected to junction 170. The current through resistor 174 is designated IR2 and flows in the direction shown by the arrow adjacent thereto. Switch 164 operates in accordance with the output at junction 158 to turn transistor 166 on and off so as to apply the voltage Vs through resistor 174.

It will be noted that the resistors 128 and 130 create a voltage at pin 6 of amplifier 122. Resistors 128 and 130 along with Vs are chosen so that the voltage Vin cannot exceed the voltage at pin 5. It is seen that when Q is high and switch 164 is off, current flows through R1 and C1 but not R2. When Q is low and switch 164 is on, current flows through R1, R2, and C1. In each case, the voltage at pin 7 changes at a constant rate between the two voltages H1 and H2 as seen in FIG. 3. The result is that the output on pin 8 of amplifier 144 is a pulse train the duty cycle of which is a linear function of the input voltage Vin. The voltage at pin 5 is preferably the voltage that will create a 100% duty cycle on pin 8. A 0% duty cycle on pin 8 is created when the currents IR1 and IR2 through resistors 114 and 174 are the same when Q is low and switch 164 is on. The values for R1 and R2 are set so that when switch 164 is on, the current IR2 is flowing through R2 is greater than the current IR1 flowing through R1. This causes current to flow from pin 5 to pin 7 through capacitor C1 and decreases the voltage at pin 7. R6 and R7 are used to bias switch 164 so that switch 164 turns off when the voltage at junction 158 is high and turns on when the voltage at junction 158 is low. R7 is not needed if the voltage at junction 158 is high enough to turn transistor 166 off.

In the following analysis, although it is not required, it will be assumed for simplicity, that the three resistors 150, 152 and 156 connected to junction point 148 of the hysteresis comparator 142 are equal. For this reason they have all been designated R3 in FIG. 4. Also, the voltages at pins 5, 6, 7, 8, 9, and 10 are defined as V5, V6, V7, V8, V9, and V10 respectively. As explained above, the voltage Vin will be assumed constant for any of the following calculations, which, for all practical purposes, is true.

The equations for the switching points of the Hysteresis Comparator 142 are as follows:

$$(Vs)\frac{\frac{1}{2}R3}{\frac{1}{2}R3+R3} = \frac{1}{3}Vs \qquad (9)$$

when V8 is high, and, $$(Vs)\frac{R3}{R3+\frac{1}{2}R3} = \frac{2}{3}Vs \qquad (10)$$

when V8 is low.

V6 is always equal to [Vs][R5/(R4+R5)] from the voltage divider, and, since the inputs to an operational amplifier connected in this manner are equal, V5 is also equal to [Vs][R5/(R4+R5)]. When switch 164 is off, which occurs when the voltage V8 is high, then IR2=0 since Vs is not applied to R2. Also, at this time, IC1=IR1 since there is no current through R2. When switch 164 is on, which occurs when voltage V8 is low, IR2=(Vs−V5)/R2 from Ohm's law. Of course, IC1=(C)(dVC1/dt) and V7=VC1+V5=VC1+[Vs][R5/(R4+R5)].

To determine the duty cycle of the output, V8, times T1 and T2 can be calculated independently. To calculate the time T1, that is, the time when V8 is high (see FIG. 2) which is also the time it takes for V7 to change from ⅓Vs to ⅔Vs from equations (9) and (10), along ramp 20 of FIG. 3, consider:

$$V7 = VC1 + V5 \qquad [11]$$

In FIG. 4, positive current flow in C1 is from right to left i.e. from pin 7 to pin 5.

IR1 is constant since Vin has been presumed constant and IR2 is constant because V8 does not change during the time T1. Of course, $$\Delta V7 = \Delta VC1 = \frac{IC1}{C1}(T1) \qquad (12)$$

for a capacitor, and, $$T1 = \frac{\Delta V7(C1)}{IC1} = \frac{\left(\frac{2}{3}Vs - \frac{1}{3}Vs\right)C1}{IC1} = \frac{\frac{1}{3}Vs(C1)}{IR1 - IR2} = \frac{\frac{1}{3}Vs(C1)}{\frac{V5 - Vin}{R1} - 0} \qquad (13)$$

$$T1 = \frac{\frac{1}{3}Vs(C1)(R1)}{V5 - Vin} \qquad (14)$$

Note that T1>0 if and only if, Vin<V5.

To calculate the time T2, that is, the time when V8 is low (see FIG. 2) which is also the time it takes for V7 to change from ⅔Vs back to ⅓Vs from equations (9) and (10), along ramp 22 of FIG. 3 consider:

Equation (12) is still valid, so, $$\Delta V7 = \Delta VC1 = \frac{IC1}{C1}(T2) \qquad (15)$$

and, $$T2 = \frac{\Delta V7(C1)}{IC1} = \frac{\left(\frac{1}{3}Vs - \frac{2}{3}Vs\right)C1}{IC1} = \frac{-\frac{1}{3}Vs(C1)}{IR1 - IR2} = \frac{-\frac{1}{3}Vs(C1)}{\frac{V5 - Vin}{R1} - \frac{Vs - V5}{R2}} \qquad (16)$$

so, $$T2 = \frac{-\frac{1}{3}Vs(C1)(R1)(R2)}{(V5 - Vin)R2 - (Vs - V5)R1} \qquad (17)$$

Note that T2>0 if, and only if Vin>V5+(V5−Vs)(R1/R2).

Finally, to show that the relationship between the duty cycle and Vin is linear, consider:

$$\frac{T1}{T1+T2} = \frac{\frac{1}{3}Vs(C1)(R1)}{V5 - Vin} \Big/ \left[ \frac{\frac{1}{3}Vs(C1)(R1)}{V5 - Vin} + \frac{-\frac{1}{3}Vs(C1)(R1)(R2)}{(V5 - Vin)R2 - (Vs - V5)R1} \right] \qquad (18)$$

which simplifies to:

$$\frac{T1}{T1+T2} = 1 - \frac{V5(R2)}{(Vs - V5)R1} + \frac{Vin(R2)}{(Vs - V5)R1} \qquad (19)$$

Therefore, the relationship between the duty cycle and the input voltage is seen to be linear as desired. It is also seen that while changing the values in equation (19) may change the slopes of the triangular wave of FIG. 3 so that the duty cycle is changed, the duty cycle remains linear with input voltage.

The following is one list of component values that have been found to provide satisfactory operation for the circuit of FIG. 4:

Vin=0 volts to 10 volts
Vs=15 volts
R1=47.5 KΩ
R2=10 KΩ
R3=10 KΩ
R4=10 KΩ
R5=40.2 KΩ
R6=10 KΩ
R7=1 KΩ
C1=0.1 μF While the component values used above provide satisfactory operation, other component values may be used.

It is seen that we have provided a voltage-to-duty cycle converter that is linear and is simple and inexpensive to implement. The circuit has a small number of components and only two operational amplifiers are needed. Since the duty cycle is linear with respect to the input voltage, the amount of software needed to calculate the value of the input voltage is minimized. The capacitor C1 is used in both the charging and discharging modes of operation and the value of the capacitor C1 does not effect the output duty cycle so that variation in its value does not change the function of the circuit.

Many changes, modifications, and substitution may occur to those of ordinary skill in the art. For example, circuits for implementing the operations of equations (1) and (2) other than an inverting integrating amplifier may be devised and the specific circuit for implementing the hysteresis converter may have other forms. Also, alternate component values may be employed without departing from the spirit of the present invention. Therefore, the structures used in describing the preferred embodiments of the present invention are not to be considered as the only ones that may be used to provide a satisfactory linear voltage-to-duty cycle converter in accordance with the teachings herein. The following claims define the scope of the present invention.

What is claimed is:

1. A voltage-to-duty cycle converter comprising:
   a first circuit having a first input to receive the voltage, (Vin), having a second input to receive a second signal and operating to produce a first output in accordance with dV/dt=K1−K2(Vin) when the second signal has a first value and to produce a second output in accordance with dV/dt=K1−K2(Vin)−K3 when the second signal has a second value, where Vin is the input voltage to be converted, K1, K2 and K3 are constants in which K1>K2(Vin) and K3>K1−K2(Vin);
   a second circuit having an input to receive the first and second outputs and operating to produce a resultant output which has a first value when receiving the first output and a second value when receiving the second output, the resultant output having a duty cycle that is linear with Vin; and
   connecting means connecting the resultant output to supply the second input to the first circuit.

2. The voltage-to-duty cycle converter of claim 1 wherein the second circuit includes a hysteresis comparator.

3. The voltage-to-duty cycle converter of claim 1 wherein the first circuit includes an inverting integrating amplifier.

4. The voltage-to-duty cycle converter of claim 1 wherein the connecting means includes a switch operable by the resultant output to "on" and "off" conditions to provide the first and second values to the second input.

5. The voltage-to-duty cycle converter of claim 1 wherein the second circuit includes a hysteresis comparator, the first circuit includes an inverting integrating amplifier and the connecting means includes a switch operable by the resultant output to "on" and "off" conditions to provide the first and second values to the second input.

6. A voltage, Vin, to duty cycle converter comprising:
an inverting integrating amplifier having an input which includes a voltage which varies with Vin, said inverting integrating amplifier being operable to produce a triangle wave output signal having up and down ramps whose slopes vary with the input;
a hysteresis comparator connected to receive the triangle wave output signal and operable to produce a resultant output which is high or low depending on the triangle wave signal; and
connecting means connecting the resultant output of the hysteresis comparator to the input of the inverting integrating amplifier to change the voltage of the input in accordance with the resultant output, the duty cycle of the high and low portions of the output varying with Vin.

7. The converter of claim 6 wherein the connecting means includes a switch operable by the resultant signal to "on" and "off" conditions and, in the "on" condition, operates to provide an additional voltage to the input of the inverting integrating amplifier.

8. The converter of claim 7 wherein the switch, in the "on" condition, connects a source of additional voltage to the input of the inverting integrating amplifier.

9. The converter of claim 8 wherein the switch includes a transistor.

10. The converter of claim 7 wherein the inverting integrating amplifier includes an operational amplifier having an inverting input connected a) through a first resistor to Vin, b) through a second resistor to the switch to receive the additional voltage and c) through a capacitor to the receive the triangular wave signal.

11. The converter of claim 10 wherein the operational amplifier has a non-inverting input connected to a source of reference voltage.

12. The converter of claim 7 wherein the hysteresis comparator includes an operational amplifier having an inverting input connected to receive the triangular wave signal and a non-inverting input connected to a source of reference voltage.

13. The converter of claim 12 wherein the resultant output is connected to the non-inverting input of the hysteresis comparator.

14. The converter of claim 7 wherein the inverting integrating amplifier includes an operational amplifier having an inverting input connected a) through a first resistor to Vin, b) through a second resistor to the switch and c) through a capacitor to the receive the triangular wave signal, the hysteresis comparator includes an operational amplifier having an inverting input connected to receive the triangular wave signal and a non-inverting input connected to a source of reference voltage, the operational amplifiers of the inverting integrating amplifier and the hysteresis comparator having a non-inverting input connected to a source of reference voltage and, the switch, in the "on" condition, connects a source of additional voltage to the second resistor.

15. A voltage, Vin, to duty cycle converter comprising:
a first operational amplifier having inverting and non-inverting inputs and an output;
a second operational amplifier having inverting and non-inverting inputs and an output;
a source of reference voltage, Vs;
a switch having "on" and "off" conditions, having an input connected to Vs and having an output to supply Vs when in the "on" condition;
first means connecting the output of the first operational amplifier to the inverting input of the second operational amplifier;
second means connecting the output of the second operational amplifier to control the switch to the "on" and "off" conditions;
third means connecting the non-inverting inputs of the first and second operational amplifiers to Vs;
fourth means connecting the output of the second operational amplifier to the non-inverting input of the second operational amplifier;
a first resistor connected between Vin and the inverting input of the first operational amplifier;
a second resistor connected between the output of the switch and the inverting input of the first operational amplifier; and,
a capacitor connected between the output of the first operational amplifier and the inverting input of the first operational amplifier.

16. The converter of claim 15 wherein the output of the first operational amplifier is a triangular wave the slopes of which vary with the voltage at the inverting input thereof and the output of the second operational amplifier is a pulse train the duty cycle of which varies with Vin.

17. The converter of claim 16 wherein the output of the second operational amplifier is a pulse train which changes from a logical "0" to a logical "1" and the switch is turned to an "on" condition whenever the pulse train is a logical "0".

18. The method of converting an input voltage, Vin, to a pulse train, the duty cycle of which varies with Vin, comprising the steps of:
A. connecting Vin to the input of an inverting integrating amplifier to produce a triangular wave output having slopes that vary with Vin;
B. connecting the input of a hysteresis comparator to receive the triangular wave output and to produce a pulse train output of duty cycle which varies with the triangular wave output;
C. connecting the pulse train output to control the "on" and "off" conditions of a switch to produce an additional voltage when in the "on" condition; and
D. connecting the switch to the input of the inverting integrating amplifier to supply the additional voltage to the input thereof.

19. The method of claim 18 wherein the inverting integrating amplifier and the hysteresis comparator comprise first and second operational amplifiers respectively, and, step A includes connecting the inverting input of the first operational amplifier through a first resistor to Vin, step B includes connecting the output of the first operational amplifier to the inverting input of the second operational amplifier, step C includes connecting the output of the second operational amplifier to the switch and, step D includes connecting the switch through a second resistor to the inverting input of the first operational amplifier, and further including step:
E. connecting a capacitor between the output of the first operational amplifier and the inverting input of the first operational amplifier.

20. The method of claim 19 further including the steps of:
F. connecting the non-inverting inputs of the inverting integrating amplifier and the hysteresis comparator to a source of reference voltage.

* * * * *